United States Patent
Hsu

(10) Patent No.: US 8,786,335 B2
(45) Date of Patent: Jul. 22, 2014

(54) SPREAD-SPECTRUM CLOCK GENERATOR

(71) Applicant: NOVATEK Microelectronics Corp., Hsin-Chu (TW)

(72) Inventor: Hung-Yuan Hsu, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/832,018

(22) Filed: Mar. 15, 2013

(65) Prior Publication Data
US 2014/0159787 A1 Jun. 12, 2014

(30) Foreign Application Priority Data
Dec. 12, 2012 (TW) .............................. 101146980 A

(51) Int. Cl.
*H03L 7/06* (2006.01)

(52) U.S. Cl.
USPC .......................................... 327/156; 327/147

(58) Field of Classification Search
USPC .................................................. 327/147, 156
See application file for complete search history.

(56) References Cited

U.S. PATENT DOCUMENTS

| | | | | |
|---|---|---|---|---|
| 8,446,194 B2* | 5/2013 | Yun et al. | ....................... | 327/156 |
| 2006/0290391 A1* | 12/2006 | Leung et al. | .................. | 327/147 |
| 2008/0094270 A1* | 4/2008 | Nys | ............................... | 341/155 |
| 2010/0164562 A1* | 7/2010 | Tseng et al. | .................. | 327/118 |
| 2011/0156782 A1* | 6/2011 | Huang et al. | .................. | 327/159 |
| 2012/0063632 A1* | 3/2012 | Aoki et al. | ..................... | 381/400 |
| 2012/0105114 A1* | 5/2012 | Yun et al. | ....................... | 327/156 |
| 2012/0112809 A1* | 5/2012 | Zhu et al. | ....................... | 327/157 |
| 2012/0242384 A1* | 9/2012 | Kato | .............................. | 327/157 |
| 2013/0127505 A1* | 5/2013 | Kanda | ............................ | 327/157 |
| 2014/0055179 A1* | 2/2014 | Gong et al. | .................... | 327/156 |

* cited by examiner

*Primary Examiner* — Adam Houston
(74) *Attorney, Agent, or Firm* — Winston Hsu; Scott Margo

(57) ABSTRACT

A spread-spectrum clock generator includes a frequency comparator, for generating a compensation signal according to a reference signal and a frequency signal corresponding to an output frequency signal; a triangle-wave generator, for generating a triangle-wave signal according to a frequency control signal; an adder, coupled between the triangle-wave generator and the frequency comparator, for adding the compensation signal to the triangle-wave signal to generate an addition result; and a frequency synthesizer, coupled between the frequency comparator and the adder, for generating the output frequency signal to adjust the output frequency signal according to the addition result so as to reduce a shift of the output frequency signal.

15 Claims, 5 Drawing Sheets

SPREAD-SPECTRUM CLOCK GENERATOR

BACKGROUND OF THE INVENTION

1. Field of the Invention

The application relates to a spread-spectrum clock generator, and more particularly, to a spread-spectrum clock generator capable of adjusting a frequency shift of an output frequency signal.

2. Description of the Prior Art

A conventional spread-spectrum clock generator can generate a spread-spectrum clock signal by using an analog or digital spread-spectrum clock generator. The bandwidth design for the analog spread-spectrum clock generator is limited by the spread-spectrum frequency standard and extra circuit layout is required to achieve the effects of spread spectrum. The analog spread-spectrum clock generator also requires a phase-locked loop to accomplish frequency synthesizing operations with high-resolution. Therefore, the level of spread spectrum easily varies with the processes. Even though a digital spread-spectrum clock generator includes a phase-locked loop, it still generates a spread-spectrum clock signal without passing a feedback route within the phase-locked loop. Therefore, the generated spread-spectrum clock signal easily has a frequency shift.

Please refer to FIG. 1, which is a schematic diagram of a spread-spectrum clock generator 10 according to the prior art. The spread-spectrum clock generator 10 includes a frequency synthesizer 100 and a triangle-wave generator 102. The frequency synthesizer 100 includes a first frequency divider 104, a phase detector 106, a loop filter 108, a voltage controlled oscillator 110, a second frequency divider 112, a third frequency divider 114 and a first sigma-delta modulator 116. The first frequency divider 100 is used for dividing a reference frequency $f_{in}$ to generate a reference signal $S_{in}$. The phase detector 106 is coupled to the first frequency divider 104 for generating a phase difference signal $S_{ph}$ according to the reference signal $S_{in}$ and a first feedback signal $S_{fb}$. The loop filter 108 is coupled to the phase detector 106 for generating a wave filtered voltage signal $S_{flt}$ according to the phase difference signal $S_{ph}$. The voltage controlled oscillator 110 is coupled to the loop filter 108 for generating a voltage output signal $S_{vo}$ according to the wave filtered voltage signal $S_{flt}$. The third frequency divider 114 is coupled between the voltage controlled oscillator 110 and the second frequency divider 112 for dividing a frequency of the voltage output signal $S_{vo}$ to generate an output frequency signal $S_{of}$. The second frequency divider 112 is coupled between the phase detector 106 and the third frequency divider 114 for generating the first feedback signal $S_{fb}$ according to the output frequency signal $S_{of}$. The first sigma-delta modulator 116 is coupled between the second frequency divider 112 and the triangle-wave generator 102 for controlling a frequency divided ratio T1 of the second frequency divider 112. The triangle-wave generator 102 is coupled to the first sigma-delta modulator 116 of the frequency synthesizer 100 for generating a triangle-wave signal $S_{tw}$ according to a frequency controlled signal $f_{tw}$.

In the frequency synthesizer 100, the second frequency divider 112 has an integer operation which is controlled by the first sigma-delta modulator 116, so that the frequency divided ratio T1 of the second frequency divider 112 is a time-variant integer and an average of the frequency divided ratio T1 becomes a non-integer value, to accomplish frequency synthesizing operations with high-resolution. After a triangle wave generated by the triangle-wave generator 102 is outputted to the frequency synthesizer 100 with high-resolution, the spread-spectrum requirement is finished. It is possible for the frequency synthesizer 100 to cause the gain change in the environment with different frequency, voltage, temperature and so on. The outputted frequency signal may become unbalanced after performing spread-spectrum operations. Therefore, how to reduce the frequency shift of the outputted frequency signal after performing spread-spectrum operations due to the different environmental factors becomes a goal for manufacturers.

SUMMARY OF THE INVENTION

The present invention therefore provides a spread-spectrum clock generator for providing a frequency compensation, to reduce the frequency shift of an output frequency signal.

A spread-spectrum clock generator is disclosed. The spread-spectrum clock generator comprises a frequency comparator, for generating a compensation signal according to a reference signal and a frequency signal corresponding to an output frequency signal; a triangle-wave generator, for generating a triangle-wave signal according to a frequency control signal; an adder, coupled between the triangle-wave generator and the frequency comparator, for adding the compensation signal to the triangle-wave signal to generate an addition result; and a frequency synthesizer, coupled between the frequency comparator and the adder, for generating the output frequency signal to adjust the output frequency signal according to the addition result so as to reduce a shift of the output frequency signal.

A method for generating a spread-spectrum clock is disclosed. The method comprises generating a compensation signal according to a reference signal and a frequency signal corresponding to an output frequency signal; generating a triangle-wave signal according to a frequency control signal; adding the compensation signal to the triangle-wave signal to generate an addition result; and generating the output frequency signal to adjust the output frequency signal according to the addition result so as to reduce a shift of the output frequency signal.

These and other objectives of the present invention will no doubt become obvious to those of ordinary skill in the art after reading the following detailed description of the preferred embodiment that is illustrated in the various figures and drawings.

DETAILED DESCRIPTION

The concept of the present invention is to compare the reference signal of the spread-spectrum clock generator with the frequency signal corresponding to the output frequency signal by using the frequency comparator, and further compensating the comparing result with the triangle-wave signal of the spread-spectrum clock generator so as to control the operations of the frequency synthesizer of the spread-spectrum clock generator in order to adjust the output frequency signal of the spread-spectrum clock generator. The frequency signal can be selected to be the feedback signal of the spread-spectrum clock generator, the output frequency signal of the spread-spectrum clock generator or the signal obtained by dividing a frequency of the output frequency signal. The reference signal and the frequency signal corresponding to the output frequency signal can be adjusted according to the system requirement, such as ratio adjustment, but is not limited herein.

Figure 1:
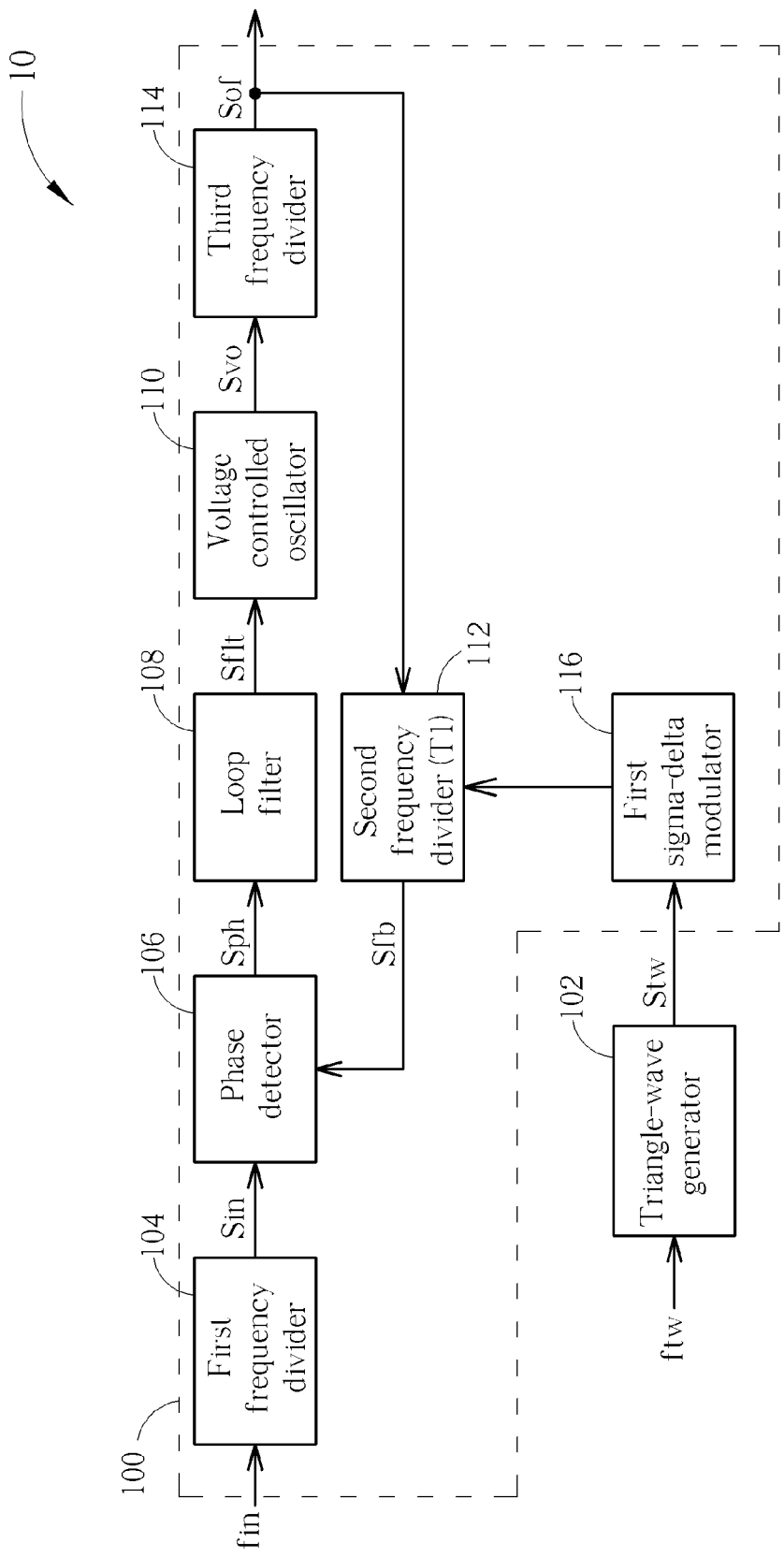
FIG. 1 is a schematic diagram of a spread-spectrum clock generator according to an example of the prior art.
Figure 2:
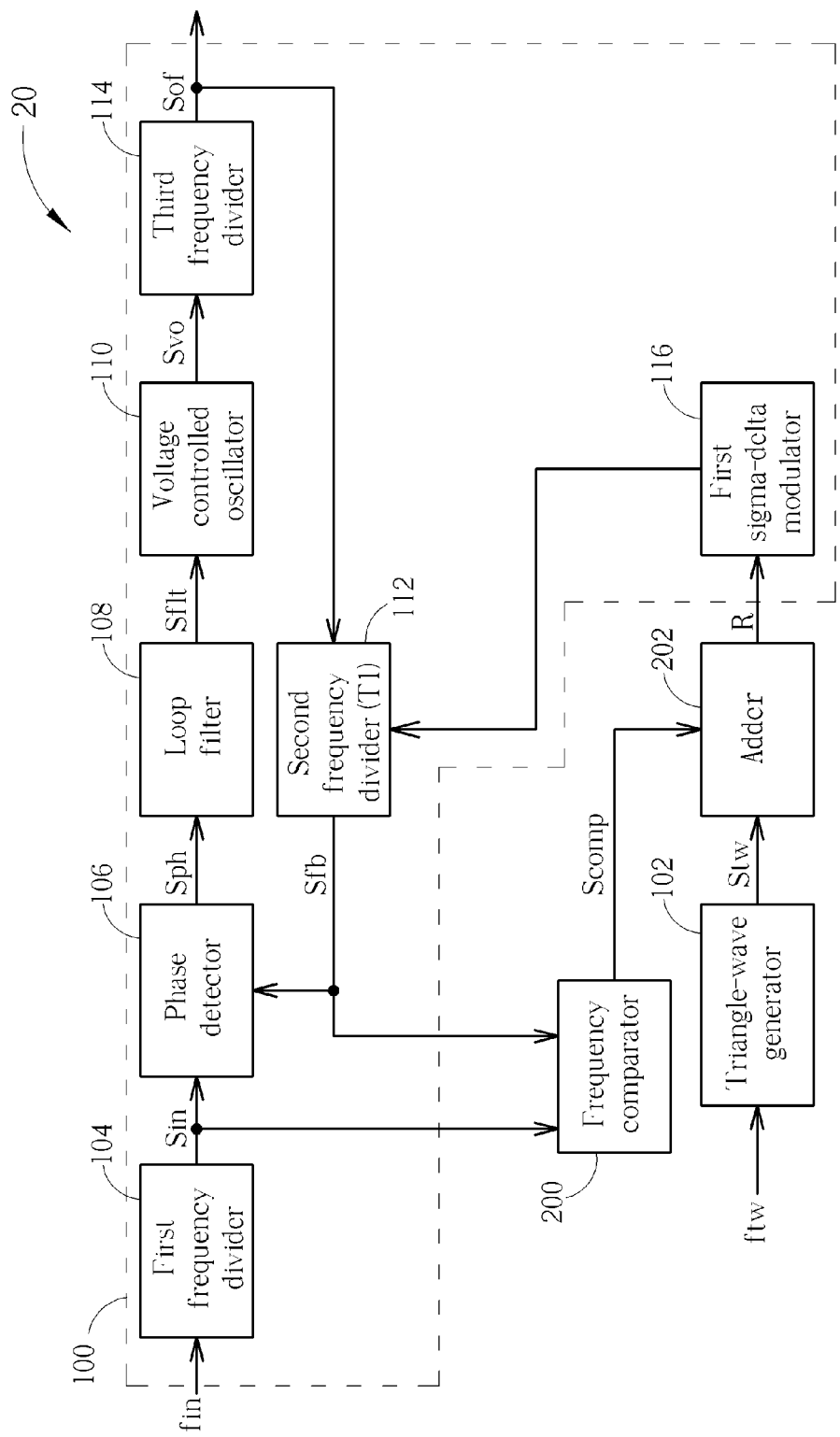
FIG. 2 is a schematic diagram of a spread-spectrum clock generator according to an example of the present invention.

Please refer to FIG. 2, which is a schematic diagram of a spread-spectrum clock generator 20 according to an example of the present invention. The spread-spectrum clock generator 20 is constructed based on the conventional spread-spectrum clock generator 10, so the same elements use the same names and symbols. Compared with the spread-spectrum clock generator 10, the spread-spectrum clock generator 20 includes a frequency comparator 200 and an adder 202. The adder 202 is coupled between the triangle-wave generator 102 and the frequency synthesizer 100. The frequency comparator 200 is coupled between the frequency synthesizer 100 and the adder 202.

In detail, the frequency comparator 200 is used for comparing the reference signal $S_{in}$ generated by the first frequency divider 100 with the first feedback signal $S_{fb}$ generated by the second frequency divider 112 and generating a compensation signal $S_{comp}$ accordingly. The adder 202 is used for compensating the compensation signal $S_{comp}$ to the triangle-wave signal $S_{tw}$, to generate an addition result R. The first sigma-delta modulator 116 further uses the addition result R to control the frequency divided ratio T1 of the second frequency divider 112, to adjust the output frequency signal $S_{of}$ of the frequency synthesizer 100. In other words, via the comparing operations of the frequency comparator 200 and the compensating operations of the adder 202, the spread-spectrum clock generator 20 can compensate the compensating result generated by the frequency comparator 200 to the triangle-wave signal $S_{tw}$ so as to control the frequency divided ratio T1 of the second frequency divider 112, in order to adjust the output frequency signal $S_{of}$ of the frequency synthesizer 100 and further reduce the average frequency shift of the output frequency signal $S_{of}$. The operations of the frequency synthesizer 10 of the spread-spectrum clock generator 20 are fully detailed in the above; therefore, no further description is included herein for brevity.

In brief, the spread-spectrum clock generator 20 uses the frequency comparator 200 to compare the reference signal $S_{in}$ with the first feedback signal $S_{fb}$ and further uses the adder 202 to add the compensating result to the triangle-wave signal $S_{tw}$ used for the spread spectrum so as to adjust the output frequency signal $S_{of}$ of the frequency synthesizer 100 and further reduce the frequency shift of the output frequency signal $S_{of}$ affected by different environmental factors.

The spread-spectrum clock generator 20 mainly regards the first feedback signal $S_{fb}$ generated by the second frequency divider 112 as the frequency signal corresponding to the output frequency signal $S_{of}$ and compares the frequency signal with the reference signal $S_{in}$, to compensate the triangle-wave signal $S_{tw}$ and adjust the output frequency signal $S_{of}$. The spread-spectrum clock generator 20 can also compare the output frequency signal $S_{of}$ with the reference signal Sin, which can accomplish the same effects.

Figure 3:
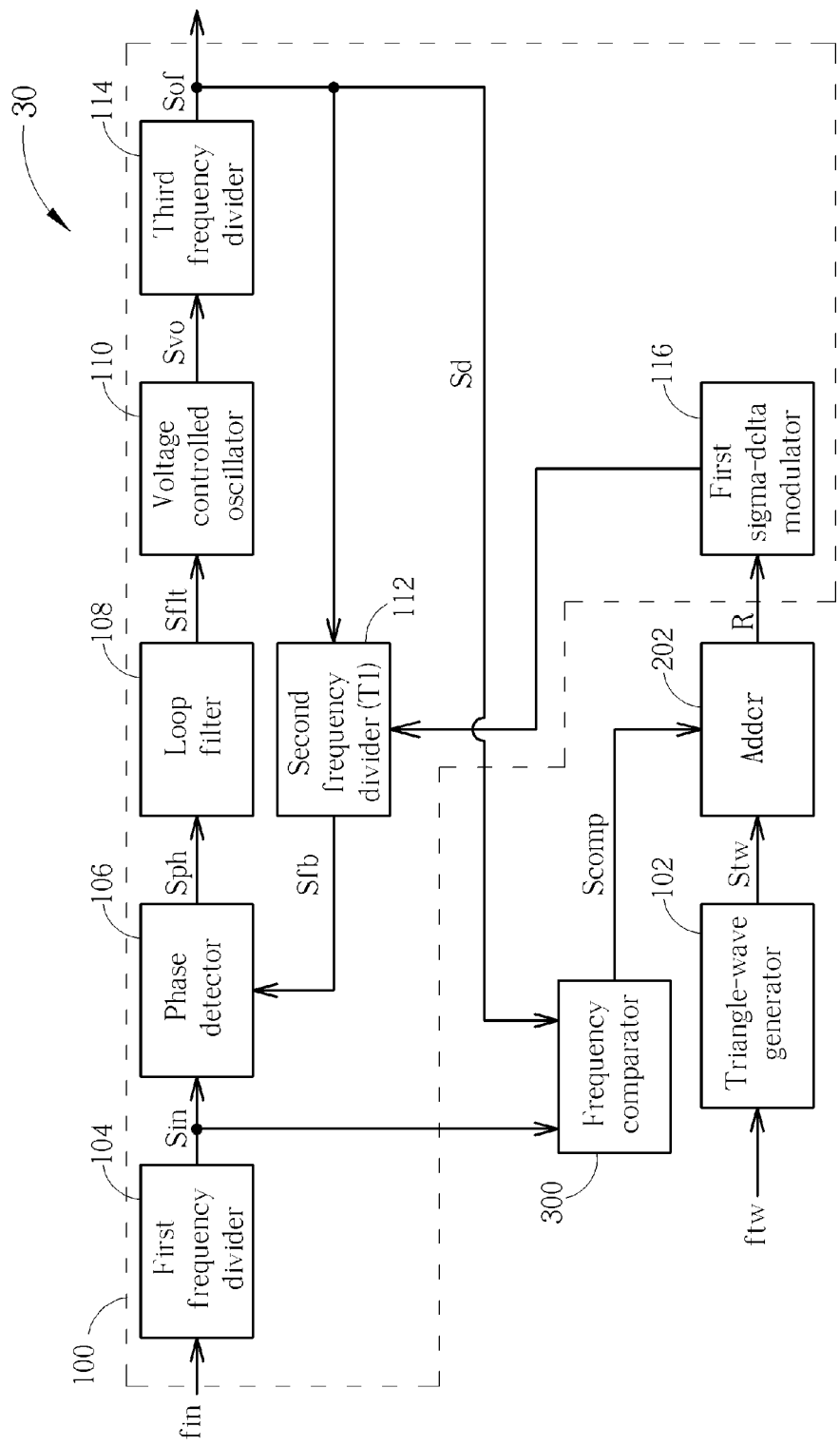
FIG. 3 is a schematic diagram of a spread-spectrum clock generator according to an example of the present invention.

Please refer to FIG. 3, which is a schematic diagram of a spread-spectrum clock generator 30 according to an example of the present invention. The spread-spectrum clock generator 30 is constructed based on the spread-spectrum clock generator 20. The structures of the spread-spectrum clock generator 20 and the spread-spectrum clock generator 30 are substantially the same. The difference is that the spread-spectrum clock generator 30 replaces the frequency comparator 200 of the spread-spectrum clock generator 20 with a frequency comparator 300. The difference between the frequency comparator 300 and the frequency comparator 200 is that the frequency comparator 300 is used for generating a compensation signal $S_{comp}$ according to the reference signal $S_{in}$ and the output frequency signal $S_{of}$. Other operations are explained above with reference to FIG. 2; therefore, no further description is provided.

Note that the frequency comparator 300 compares the reference signal $S_{in}$ with the output frequency signal $S_{of}$ and adds the comparing result to the triangle-wave signal $S_{tw}$ used for the spread spectrum in order to adjust the output frequency signal $S_{of}$ of the frequency synthesizer 100. In other words, the frequency comparator 300, the adder 202 and the frequency synthesizer 100 form a loop which includes the phase-locked loop of the frequency synthesizer 100 (composed of the phase detector 106, the loop filter 108, the voltage controlled oscillator 110, the second frequency divider 112 and the third frequency divider 114). Therefore, the compensation signal $S_{comp}$ generated by the frequency comparator 300 can be fed back to the phase-locked loop of the frequency synthesizer 100. The compensating result of the frequency comparator 300 further affects the output frequency signal $S_{of}$ when the frequency synthesizer 100 generates the output frequency signal $S_{of}$. The previous spread-spectrum operations can affect the next spread-spectrum operations via the compensating operations.

In brief, the spread-spectrum clock generator 30 uses the comparing result of the frequency comparator 300 to adjust the output frequency signal $S_{of}$ of the frequency synthesizer 100, so that the frequency shift of the output frequency signal $S_{of}$ which is affected by different environmental factors can be reduced and the output frequency signal $S_{of}$ may also be affected by the compensating result of the frequency comparator 300.

Figure 4:
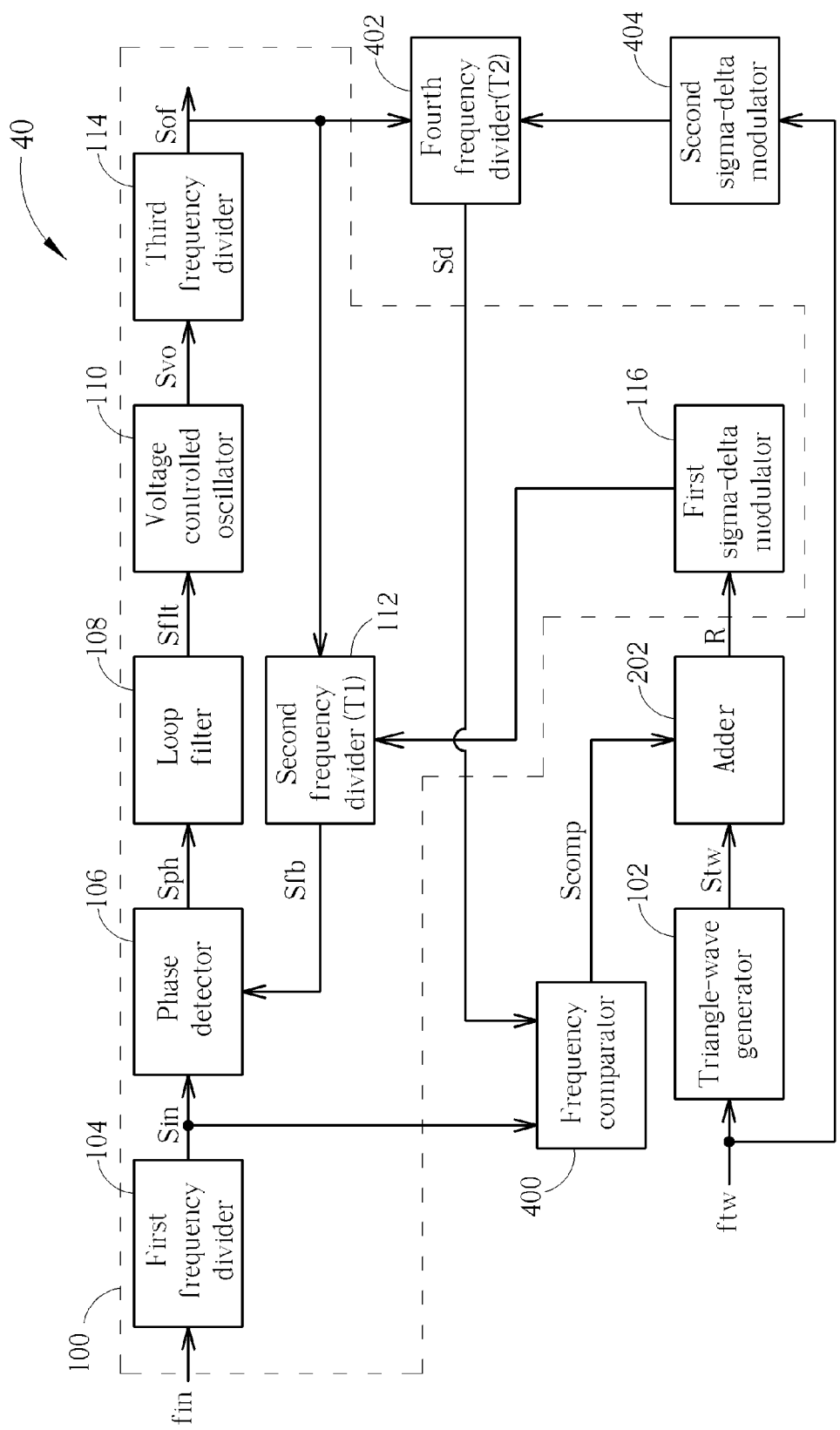
FIG. 4 is a schematic diagram of a spread-spectrum clock generator according to an example of the present invention.

The present invention further regards the signal obtained by dividing a frequency of the output frequency signal $S_{of}$ as the frequency signal corresponding to the output frequency signal $S_{of}$. Please refer to FIG. 4, which is a schematic diagram of a spread-spectrum clock generator 40 according to an example of the present invention. The spread-spectrum clock generator 40, compared with the spread-spectrum clock generator 30, increases a fourth frequency divider 402 and a second sigma-delta modulator 404 and replaces the frequency comparator 300 with a frequency comparator 400. The fourth frequency divider 402 is coupled between the third frequency divider 114 and the frequency comparator 400 for dividing a frequency of the output frequency signal $S_{of}$ to generate a frequency divided signal $S_d$ and output the frequency divided signal $S_d$ to the frequency comparator 400. The second sigma-delta modulator 404 is coupled to the fourth frequency divider 402 for controlling a frequency divided ratio T2 of the fourth frequency divider 402 via the frequency controlled signal $f_{tw}$ used for generating the triangle-wave signal $S_{tw}$. Moreover, the frequency comparator 400 generates the compensation signal $S_{comp}$ according to the reference signal $S_{in}$ and the frequency divided signal $S_d$, to compare the frequency signal $S_{in}$ with the frequency divided signal $S_d$ in the same ratio, which is different from the frequency comparator 300. In addition, the fourth frequency divider 402 performs an integer operation and the operations of the fourth frequency divider 402 are controlled by the second sigma-delta modulator 404, so that the frequency divided ratio T2 of the fourth frequency divider 402 is a time-variant integer and an average of the frequency divided ratio T2 becomes a non-integer value. Other operations are explained above with reference to FIG. 3; therefore, no further description is provided herein.

Figure 5:
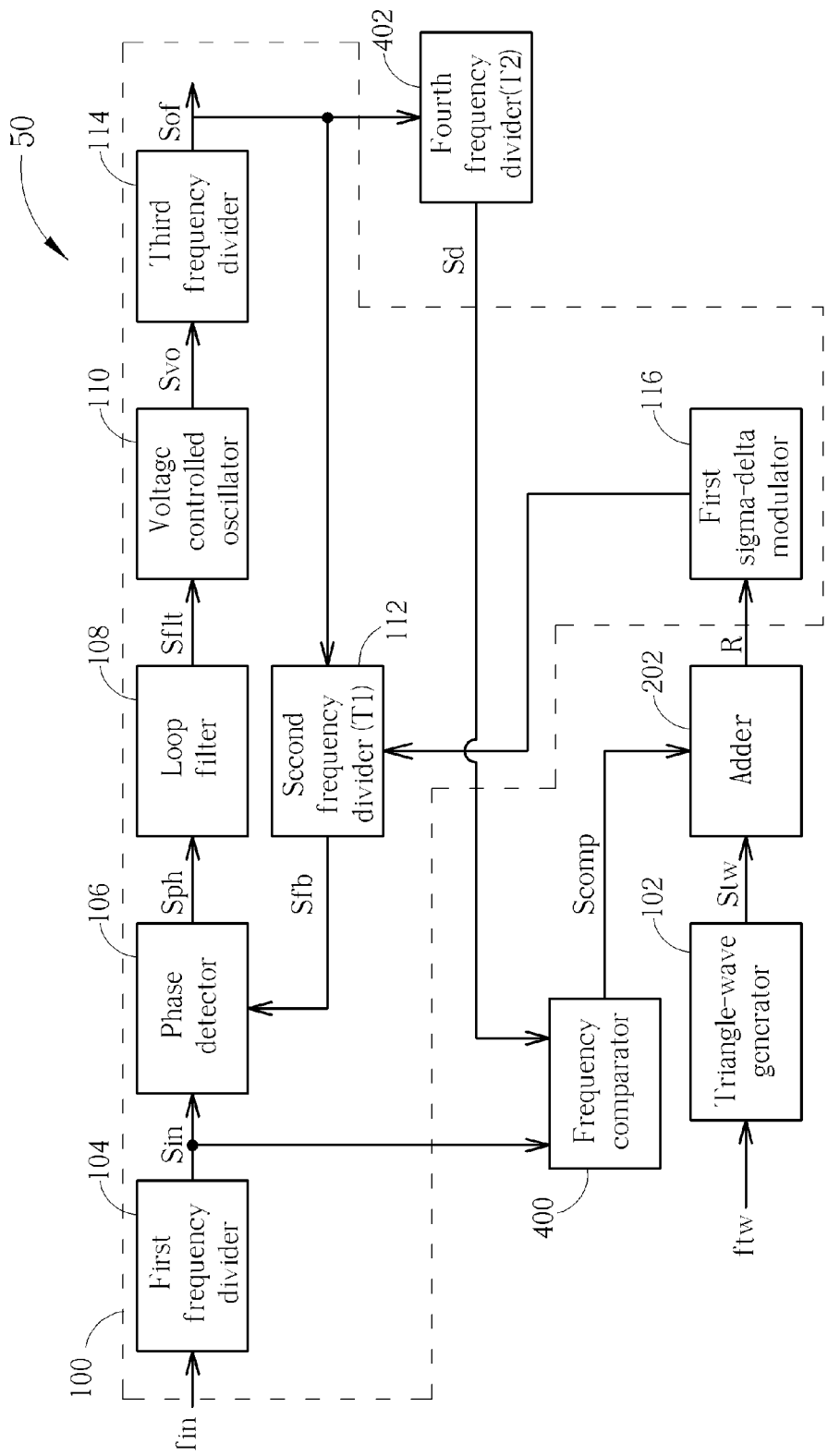
FIG. 5 is a schematic diagram of a spread-spectrum clock generator according to an example of the present invention.

Note that the fourth frequency divider 402 and the second sigma-delta modulator 404 are used for adjusting the reference signal $S_{in}$ and the output frequency signal $S_{of}$ to have the same ratio. Therefore, if the frequency divided signal $S_d$ of the output frequency signal $S_{of}$ and the reference signal $S_{in}$ have the same ratio via the fourth frequency divider 402, the second sigma-delta modulator 404 can be neglected, which is illustrated by the spread-spectrum clock generator 50 in FIG. 5. For the same reason, if the output frequency signal $S_{of}$ and the reference signal $S_{in}$ have the same ratio via the third frequency divider 114, the fourth frequency divider 402 and the second sigma-delta modulator 404 can be neglected as illustrated in FIG. 3.

In brief, the operations of the spread-spectrum clock generator 40 and the spread-spectrum clock generator 30 are substantially the same. The difference is that the spread-spectrum clock generator 40 adjusts the reference signal $S_{in}$ and the output frequency signal $S_{of}$ to have the same ratio when the reference signal $S_{in}$ and the output frequency signal $S_{of}$ cannot be adjusted to the same ratio, so that the frequency comparator 400 can execute comparing operations normally. Therefore, the spread-spectrum clock generator 40 can still reduce the frequency shift of the output frequency signal $S_{of}$ affected by different environmental factors as the spread-spectrum clock generator 30 does, and the compensating result of the frequency comparator 400 may also affect the output frequency signal $S_{of}$.

The above-mentioned spread-spectrum clock generators 20, 30 and 40 can be summarized to a method for generating a spread-spectrum clock signal, the method including a frequency comparator (which can be the frequency comparator 200, the frequency comparator 300 or the frequency comparator 400) for generating the compensation signal $S_{comp}$ according to the reference signal $S_{in}$ and the frequency signal corresponding to the output frequency signal $S_{of}$. Moreover, the triangle-wave generator 102 generates the triangle-wave signal $S_{tw}$ according to the frequency controlled signal $f_{tw}$ and the adder 202 compensates the compensation signal $S_{comp}$ to the triangle-wave signal $S_{tw}$ to generate the addition result R. The frequency synthesizer 100 further generates the output frequency signal $S_{of}$ and adjusts the output frequency signal $S_{of}$ according to the addition result R, so as to reduce the frequency shift of the output frequency signal $S_{of}$. The frequency signal corresponding to the output frequency signal $S_{of}$ can be selected to be the first feedback signal $S_{fb}$, the output frequency signal $S_{of}$ or the frequency divided signal $S_d$ obtained by dividing a frequency of the output frequency signal $S_{of}$. The detailed description of the method is explained in the above; therefore, no further description is provided herein.

In the prior art, the spread-spectrum clock generator does not generate the spread-spectrum clock signal via passing the feedback route of the phase-locked loop, so that the generated spread-spectrum clock signal has shifted easily. Moreover, the gain of the frequency synthesizer of the spread-spectrum clock generator is changed in an environment with different frequency, voltage, temperature and so on. Therefore, the outputted frequency signal with spread spectrum is unbalanced. In comparison, the spread-spectrum clock generator of the present invention additionally includes a frequency comparator to compare the reference signal of the frequency synthesizer with the output frequency signal and uses an adder to add the comparing result to the triangle-wave signal used for the spread spectrum so as to adjust the output frequency signal of the spread-spectrum clock generator, to reduce the frequency shift of the output frequency signal affected by different environmental factors.

To sum up, via the operations of the frequency comparator and the adder, the spread-spectrum clock generator of the present invention can compensate the compensating result generated by the frequency comparator with the triangle-wave signal used for the spread spectrum, to reduce the frequency shift of the output frequency signal of the spread-spectrum clock generator affected by different environmental factors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A spread-spectrum clock generator, comprising:
   a frequency comparator, for generating a compensation signal according to a reference signal and a frequency signal corresponding to an output frequency signal;
   a triangle-wave generator, for generating a triangle-wave signal according to a frequency control signal;
   an adder, coupled between the triangle-wave generator and the frequency comparator, for adding the compensation signal to the triangle-wave signal to generate an addition result; and
   a frequency synthesizer, coupled between the frequency comparator and the adder, for generating the output frequency signal to adjust the output frequency signal according to the addition result so as to reduce a shift of the output frequency signal.

2. The spread-spectrum clock generator of claim 1, wherein the frequency synthesizer comprises:
   a first frequency divider, utilized for dividing a frequency of a reference frequency, to generate the reference signal;
   a phase detector, coupled to the first frequency divider, utilized for generating a phase difference signal according to the reference signal and a first feedback signal;
   a loop filter, coupled to the phase detector, for generating a wave filtered voltage signal according to the phase difference signal;
   a voltage controlled oscillator, coupled to the loop filter, utilized for generating the output frequency signal according to the wave filtered voltage signal;
   a second frequency divider, coupled between the phase detector and the voltage controlled oscillator, for generating the first feedback signal according to the output frequency signal;
   a third frequency divider, coupled between the voltage controlled oscillator and the second frequency divider, for dividing a frequency of the output frequency signal, to generate the output frequency signal; and
   a first sigma-delta modulator, coupled between the second frequency divider and the adder, for controlling a first frequency divided ratio of the second frequency divider according to the addition result.

3. The spread-spectrum clock generator of claim 2, wherein the frequency signal corresponding to the output frequency signal is the first feedback signal.

4. The spread-spectrum clock generator of claim 2, wherein the frequency signal corresponding to the output frequency signal is the output frequency signal.

5. The spread-spectrum clock generator of claim 4, further comprising a fourth frequency divider, for dividing a frequency of the output frequency signal, to generate a frequency divided signal as the frequency signal.

6. The spread-spectrum clock generator of claim 5, further comprising a second sigma-delta modulator, coupled to the fourth frequency divider, for controlling a second frequency divided ratio of the fourth frequency divider.

7. The spread-spectrum clock generator of claim 5, wherein the fourth frequency divider is an integer frequency divider and the second frequency divided ratio is a time-variant integer, for making an average of the second frequency divided ratio be a non-integer value.

8. The spread-spectrum clock generator of claim 2, wherein the first frequency divider is an integer frequency divider and the first frequency divided ratio is a time-variant integer, for making an average of the first frequency divided ratio be a non-integer value.

9. A method for generating a spread-spectrum clock, the method comprising:
   generating a compensation signal according to a reference signal and a frequency signal corresponding to an output frequency signal;
   generating a triangle-wave signal according to a frequency control signal;
   adding the compensation signal to the triangle-wave signal to generate an addition result; and
   generating the output frequency signal to adjust the output frequency signal according to the addition result so as to reduce a shift of the output frequency signal.

10. The method of claim 9, wherein the steps of adjusting the output frequency signal according to the addition result synthesizer comprise:
   dividing a frequency of a reference frequency, to generate the reference signal;
   generating a phase difference signal according to the reference signal and a first feedback signal filtering the phase difference signal to generate a wave filtered voltage signal;
   generating the output frequency signal according to the wave filtered voltage signal;
   deciding a first frequency divided ratio according to the addition result; and
   dividing a frequency of the output frequency signal, to generate the output frequency signal.

11. The method of claim 10, wherein the frequency signal corresponding to the output frequency signal is the first feedback signal.

12. The method of claim 10, wherein the frequency signal corresponding to the output frequency signal is the output frequency signal.

13. The method of claim 12, further comprising dividing a frequency of the output frequency signal according to a second frequency divided ratio.

14. The method of claim 13, wherein the frequency dividing operation is an integer frequency dividing operation and the second frequency divided ratio is a time-variant integer, for making an average of the second frequency divided ratio be a non-integer value.

15. The method of claim 10, wherein the frequency dividing operation is an integer frequency divider and the first frequency divided ratio is a time-variant integer, for making an average of the first frequency divided ratio be a non-integer value.

* * * * *